(12) United States Patent
Kawahara et al.

(10) Patent No.: US 6,518,501 B1
(45) Date of Patent: Feb. 11, 2003

(54) ELECTRONIC PART AND METHOD OF ASSEMBLING THE SAME

(75) Inventors: Hiroshi Kawahara, Tokyo (JP); Minoru Sakai, Tokyo (JP); Yasushi Yamamoto, Tokyo (JP)

(73) Assignee: NRS Technologies Inc. (JP)

( * ) Notice: Subject to any disclaimer, the term of this patent is extended or adjusted under 35 U.S.C. 154(b) by 0 days.

(21) Appl. No.: 09/696,580

(22) Filed: Oct. 25, 2000

(30) Foreign Application Priority Data

Oct. 26, 1999 (JP) ............................. 11-304531
Nov. 29, 1999 (JP) ............................. 11-337875

(51) Int. Cl.$^7$ ............................................ H01L 23/02
(52) U.S. Cl. ..................... 174/52.4; 257/692; 257/698; 257/704
(58) Field of Search .................. 174/52.2, 52.4; 257/690, 692, 693, 696, 701, 702, 704, 728, 773, 698; 438/118, 123

(56) References Cited

U.S. PATENT DOCUMENTS

| | | | | |
|---|---|---|---|---|
| 5,041,696 A | * | 8/1991 | Utner ........................ | 174/52.4 |
| 5,436,492 A | * | 7/1995 | Yamanaka ................... | 257/433 |
| 5,438,305 A | * | 8/1995 | Hikita et al. ................... | 333/32 |
| 5,541,447 A | * | 7/1996 | Maejima et al. ............. | 257/669 |
| 5,596,171 A | * | 1/1997 | Harris et al. ................ | 174/52.4 |
| 5,638,253 A | * | 6/1997 | Hasegawa ................... | 361/535 |
| 6,011,303 A | * | 1/2000 | Tanaka et al. ............... | 257/692 |
| 6,281,436 B1 | * | 8/2001 | Gotoh et al. ................ | 174/52.3 |
| 6,313,525 B1 | * | 11/2001 | Sasano ........................ | 257/704 |

FOREIGN PATENT DOCUMENTS

| | | | |
|---|---|---|---|
| JP | 56-15830 | | 4/1981 |
| JP | 5-63495 | | 3/1993 |
| JP | 6-13276 | | 5/1994 |
| JP | 6-188672 | | 7/1994 |
| JP | 2600689 | | 1/1997 |
| JP | 11-163183 | | 6/1999 |
| JP | 11-261364 | | 9/1999 |
| WO | WO99/08320 | * | 2/1999 |

* cited by examiner

*Primary Examiner*—Chau N. Nguyen
*Assistant Examiner*—Carmelo Oliva
(74) *Attorney, Agent, or Firm*—Dickstein, Shapiro, Morin & Oshinsky, LLP.

(57) ABSTRACT

An electronic part in which a surface acoustic wave device or the like is packaged by using a resin. The electronic part has a resin base in which a lead frame and a resin are integrally molded, a surface acoustic wave device or the like mounted on the top face of the resin base, a bonding wire for connecting a lead portion on the top face of the resin base and the electronic device, and a resin cap which is bonded on the resin base so as to form a space between the resin cap and the resin base. Apart of the lead is bent along the surface of the plastic package. It is also possible to dispose the surface acoustic wave device so that its electrode pattern formation surface faces the resin base without using the bonding wire.

16 Claims, 8 Drawing Sheets

ELECTRONIC PART AND METHOD OF ASSEMBLING THE SAME

BACKGROUND OF THE INVENTION

1. Field of the Invention

The present invention relates to an electronic part and a method of assembling the same. More particularly, the invention relates to an electronic part having therein a surface acoustic wave device or the like for use in a resonator and a frequency band filter of a portable telephone or the like and to a method of assembling the same.

2. Description of the Related Prior Art

An electronic device such as a surface acoustic wave device is conventionally mounted in a ceramic case or a metal case. For example, a ceramic case has a ceramic substrate on which an electronic device is mounted, some ring-shaped ceramic layers formed on the ceramic substrate, a metal ring in the uppermost layer, and a metal cap connected to the metal ring by a method of seam welding or the like. Since the electronic device and an external terminal of a bottom face of the ceramic substrate have to be electrically connected to each other, the ceramic layer has a wiring layer or internal wiring such as a through hole. A predetermined ceramic layer has a bonding pad which is connected to the internal wiring. The electronic device is connected to the bonding pad via a bonding wire. In the ceramic package, however, it is necessary to form the internal wiring and to stack ceramic layers. Each time the package size or wiring position is changed, a new mold for forming ceramic layers is needed. When the metal cap is sealed by seam welding, the metal ring has to be brazed on the ceramic layer. In the case of sealing the metal cap by solder, special solder is necessary. For the reasons, it is difficult to realize low cost of the electronic part.

As an example of an electronic part having a resin case which can be manufactured at low cost, Japanese Examined Utility Model Publication No. 56-015830 discloses an electronic part in which an insulating resin layer is formed on the outside of a surface acoustic wave device by a dip method and a conductive film is formed on the outside of the insulating resin layer. In the electronic part, expansion and contraction of the resin due to a change in outside temperature causes a change in characteristics of the surface acoustic wave device and a break in the bonding wire. Each of Japanese Patent Unexamined Publication Nos. Hei-05-063495 and Hei-06-188672 and Japanese Patent No. 2600689 discloses an electronic part in which a resin mold having a space is provided on a surface acoustic wave device or a semiconductor chip fixed on a metal lead frame. In the electronic part disclosed, the surface acoustic wave device or the semiconductor chip is directly mounted on the metal lead frame. With such a configuration, stray capacitances are generated and high frequency characteristics deteriorate. Each of the first and second literatures discloses an electronic part having an SIP (Single In-line Package) structure, that is, a configuration in which a lead extends linearly from one of the sides of the package. In the electronic part having the SIP structure, however, leads are concentrated on one of the sides of the package. Consequently, a tilt occurs when the electronic part is mounted on a printed board and an adverse influence is exerted on the characteristics of the electronic part.

SUMMARY OF THE INVENTION

It is therefore an object of the invention to provide a very reliable electronic part having small outer dimensions, and a method of manufacturing an electronic part by a simple assembling process with improved productivity at low cost.

An electronic part having a plastic package of the invention has: a resin base having a lead which is disposed from the top face to the outside of the plastic package; at least one electronic device mounted on the top face of the resin base; a conductor for connecting a lead portion on the top face of the resin base and the electronic device; and a resin cap which is bonded on the resin base so as to form a space between the resin cap and the resin base. In a specific example of the electronic part, the electronic device includes a surface acoustic wave device and is mounted in a recess in the top face of the resin base. The electronic device is disposed so that its electrode pattern forming surface faces the top face of the resin base via a space. At this time, the electrode pattern and the lead on the top face of the resin base are electrically connected to each other via a conductor. A part of the lead of the electronic part can be formed on a side face and/or a bottom face of the resin base. The whole lead which is on the outside of the plastic package can be formed on the surface of the plastic package. The lead is formed so as to extend from the top face of the resin base around the electronic device to an outer region of the resin base.

A method of assembling the electronic part has the steps of: forming a resin base by integrally molding a lead frame having a plurality of terminals and a resin so that a part of the lead frame is disposed from the top face of the resin base to the outside of the plastic package; mounting an electronic device on the top face of the integrally molded resin base; electrically connecting the electronic device mounted and a lead portion on the top face of the resin base; bonding a pre-molded resin cap and the resin base; and cutting a predetermined portion of the lead frame. The assembling method can further have a step of bending the lead portion extended from the plastic package along the surface of the plastic package.

According to the invention, a small, very reliable electronic part can be obtained by a simple process.

BRIEF DESCRIPTION OF THE DRAWINGS

The above and other objects, features and advantages of the present invention will become apparent from the following detailed description when taken with the accompanying drawings in which.

DETAILED DESCRIPTION OF THE PREFERRED EMBODIMENTS

Figure 1:
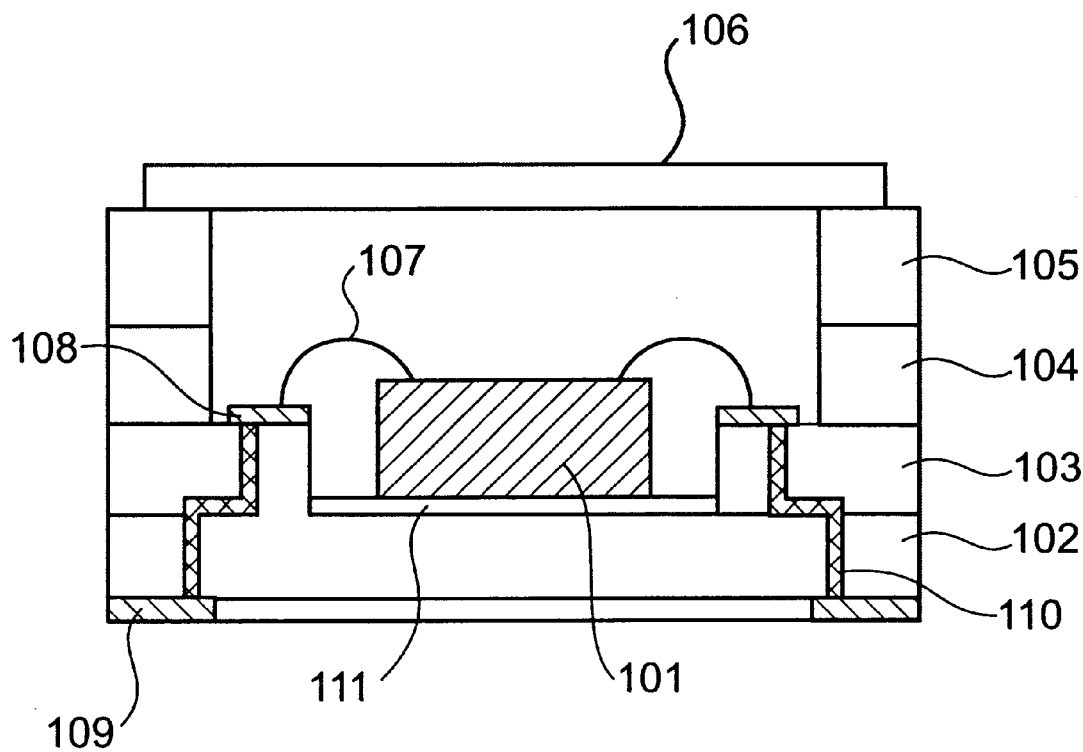
FIG. 1 is a cross section of an electronic part having a conventional ceramic case.

Referring to FIG. 1, the lower portion of a conventional ceramic case of an electronic part is formed by stacking a lowest ceramic layer 102, an intermediate layer 103, and an upper layer 104. A chip 101 is mounted in an area on which a metal plating 111 is applied on the top face of the lowest ceramic layer 102. In order to electrically connect the chip 101 and an external terminal 109 as a surface mounting pad, internal wiring 110 such as a through hole is formed in the lowest layer 102 and the intermediate layer 103. The chip 101 is connected to a bonding pad 108 via a bonding wire 107. After that, a metal ring 105 and a cap 106 are formed by seam welding or the like. However, the cost of the ceramic case is high.

Figure 2:
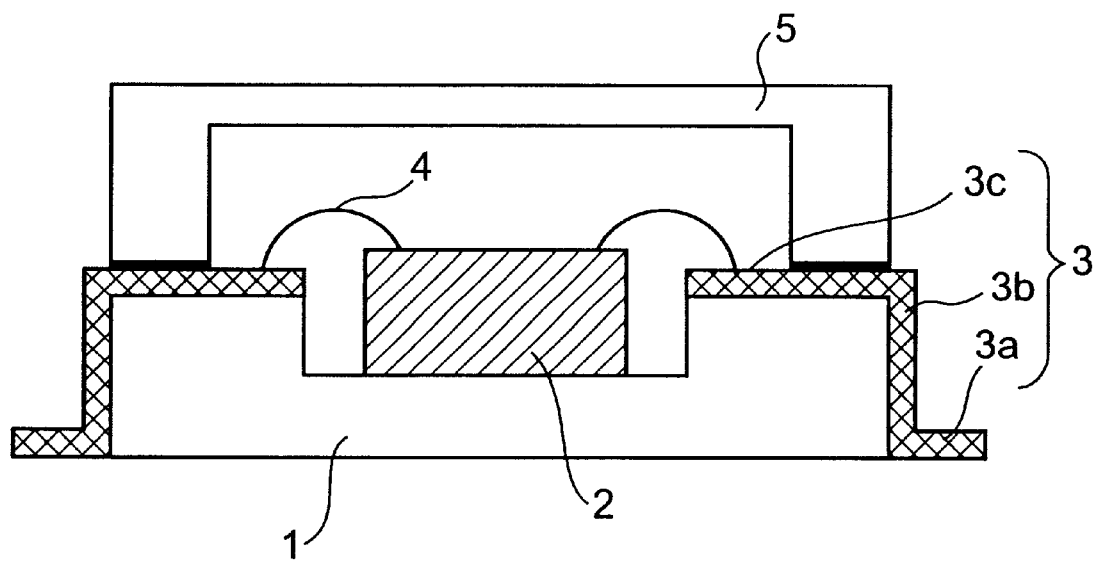
FIG. 2 is a cross section of an electronic part according to a first embodiment of the invention.

Referring to FIG. 2, an electronic part according to a first embodiment of the invention has a resin base 1 obtained by integrally forming a lead frame and a resin base by premolding, an electronic device 2 adhered in a recess formed in the top face of the resin base 1 by an adhesive, a lead 3 for supplying an electric signal to the electronic device 2, a bonding wire 4 for connecting the electronic device 2 and the lead 3, and a resin cap 5 which is bonded to the resin base 1 so as to form a space area. In the example, portions 3b and 3c of the lead 3 are formed on the surface of the resin base 1, and the other portion 3a in the lead 3 extends along the bottom face of the resin base to the outside of the resin base. The lead portion 3a is therefore provided in a part of the adhering faces of the resin base 1 and the resin cap 5. The electronic device 2 is a surface acoustic wave device in which an inter-digital aluminum electrode pattern is disposed on a quartz substrate. The electronic device 2 can be formed by using, not necessarily a quartz substrate, a lithium niobate substrate, a lithium tantalate substrate, or the like. The inter-digital electrode can be made of a material such as aluminum or an aluminum-copper alloy. The lead 3 can be made of a copper-iron alloy, an iron-nickel alloy, or the like. As an adhesive for adhering the electronic device 2 to the resin base 1, a silicone adhesive, an epoxy adhesive, silver paste, or the like can be used. The bonding wire 4 is made of gold or aluminum. The resin cap 5 can be made of a thermosetting resin such as epoxy resin or a thermoplastic resin such as polyphenylene sulfide resin.

Figure 3:
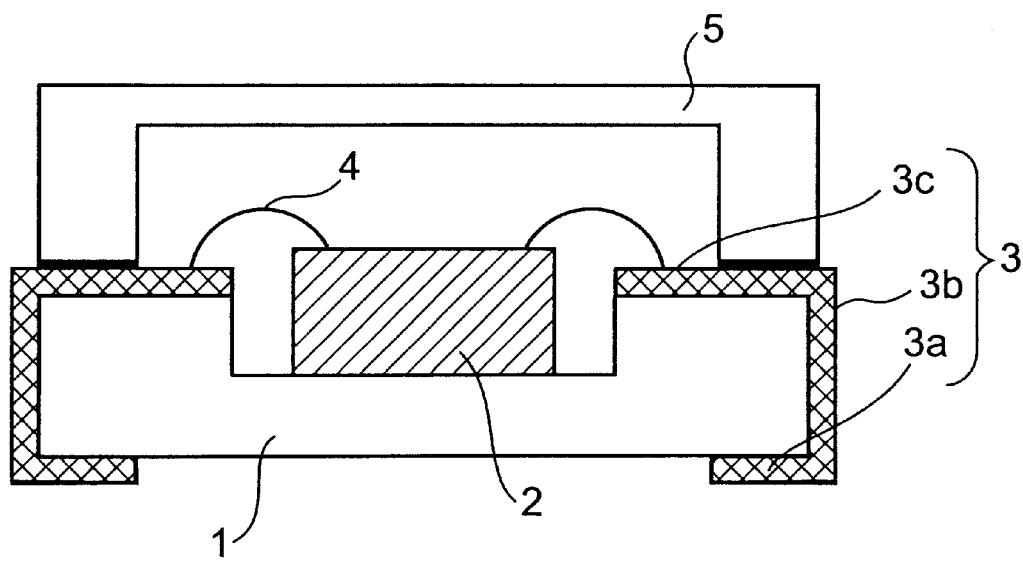
FIG. 3 is a cross section of an electronic part according to a second embodiment of the invention.

Referring to FIG. 3, an electronic part according to a second embodiment is different from the first embodiment with respect to the configuration of the resin base 1. The lead portion 3a is bent to the bottom face side of the resin base 1. Consequently, the mounting area of the electronic part can be reduced.

Figure 4:
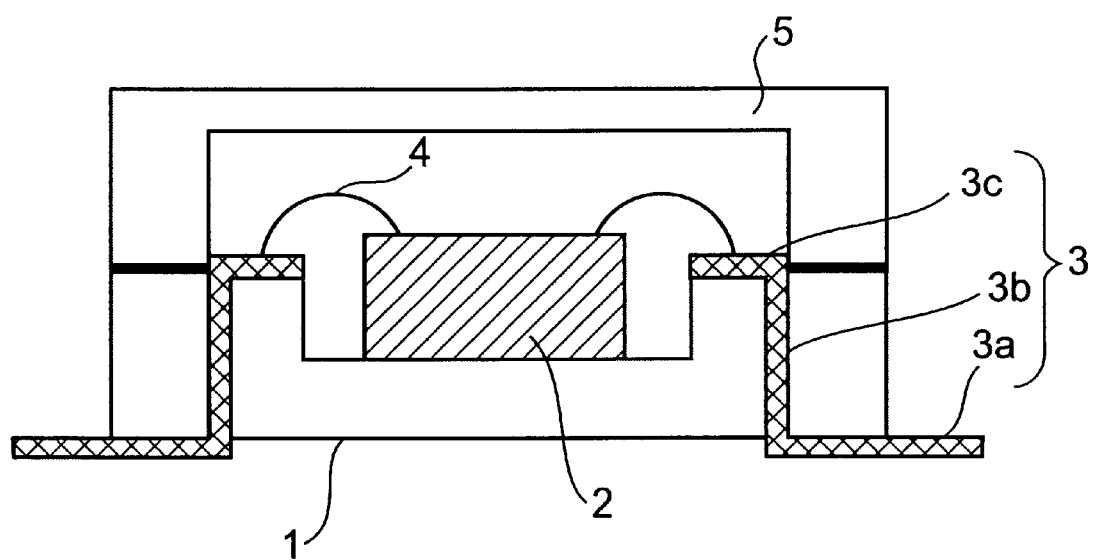
FIG. 4 is a cross section of an electronic part according to a third embodiment of the invention.

Referring to FIG. 4, in an electronic part according to a third embodiment, the lead portion 3c is formed in a part of the top face of the resin base 1, the lead portion 3b is formed in the resin base, and the lead portion 3a extends along the bottom face of the resin base to the outside. In the plastic package, the lead portion 3 does not exist in the adhering faces between the resin cap 5 and the resin base. Consequently, the resin cap 5 can be more securely sealed.

Figure 5:
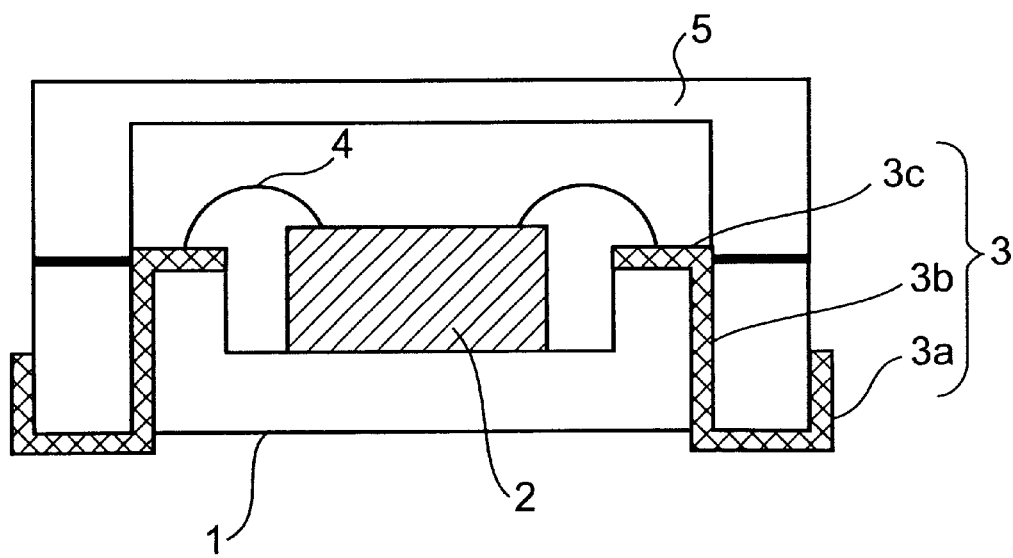
FIG. 5 is a cross section of an electronic part according to a fourth embodiment of the invention.

Referring to FIG. 5, an electronic part according to a fourth embodiment is similar to that of the third embodiment except that the lead portion 3a is bent along the bottom face and side faces of the resin base 1.

Figure 6:
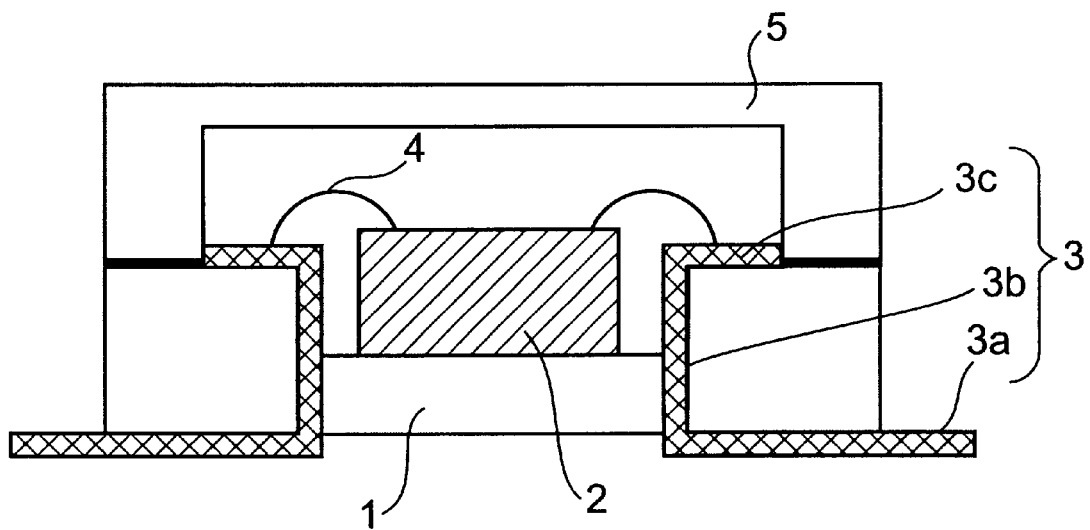
FIG. 6 is a cross section of an electronic part according to a fifth embodiment of the invention.
Figure 7:
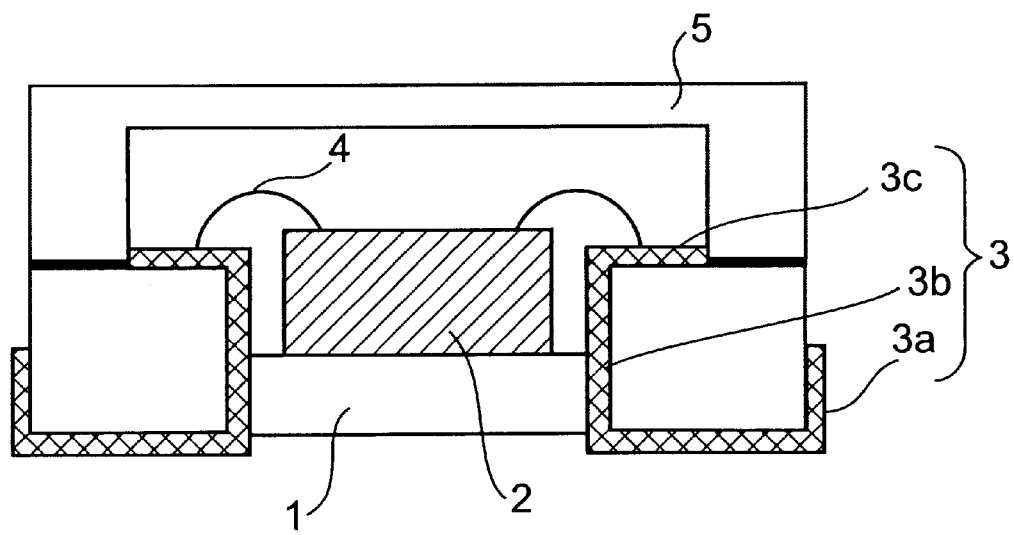
FIG. 7 is a cross section of an electronic part according to a sixth embodiment of the invention.

Referring to FIGS. 6 and 7, in fifth and sixth embodiments, the lead 3 is formed on the top face of the resin base 1 and the side faces of the recess in which the electronic device is mounted, and the lead portion 3a is bent along the bottom face of the resin base 1. Particularly, in the sixth embodiment, the lead portion 3a is bent further along the side faces of the resin base 1.

Figure 8:
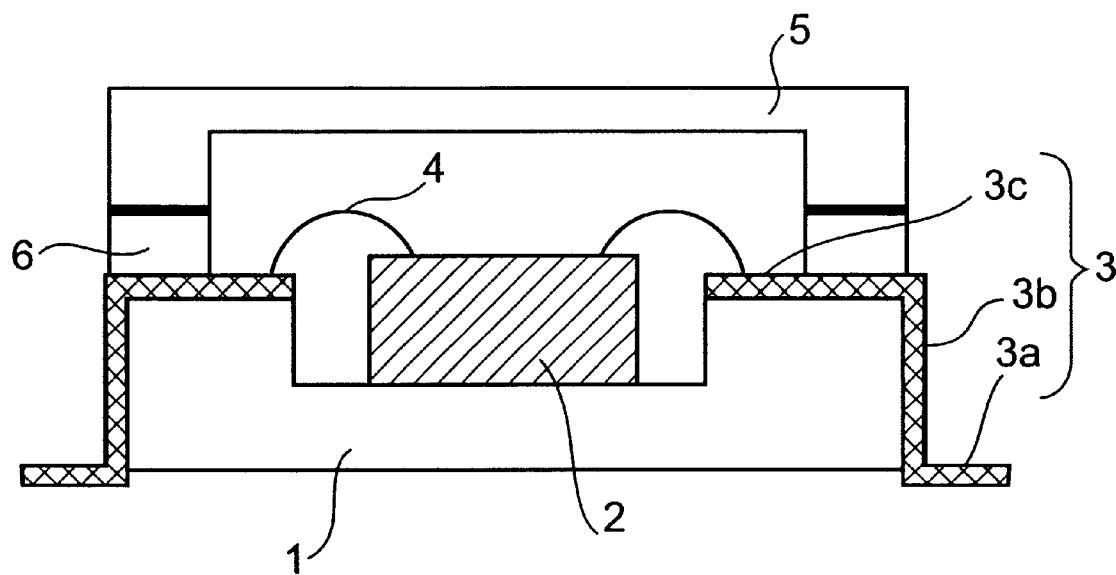
FIG. 8 is a cross section of an electronic part according to a seventh embodiment of the invention.

Referring to FIG. 8, in an electronic part according to a seventh embodiment, the top face of the resin base 1 is constructed by two faces having different heights. The higher face serves as the adhering face to the resin cap 5. On the lower face, the lead portion 3c is formed. The lead portion 3b is formed along the side face of the resin base 1, and the lead portion 3a extends in the direction of the bottom face of the resin base 1. In the configuration, a large space can be created between the electronic device and the resin cap 5, so that a sufficient clearance for forming the bonding wire 4 can be obtained.

Figure 9:
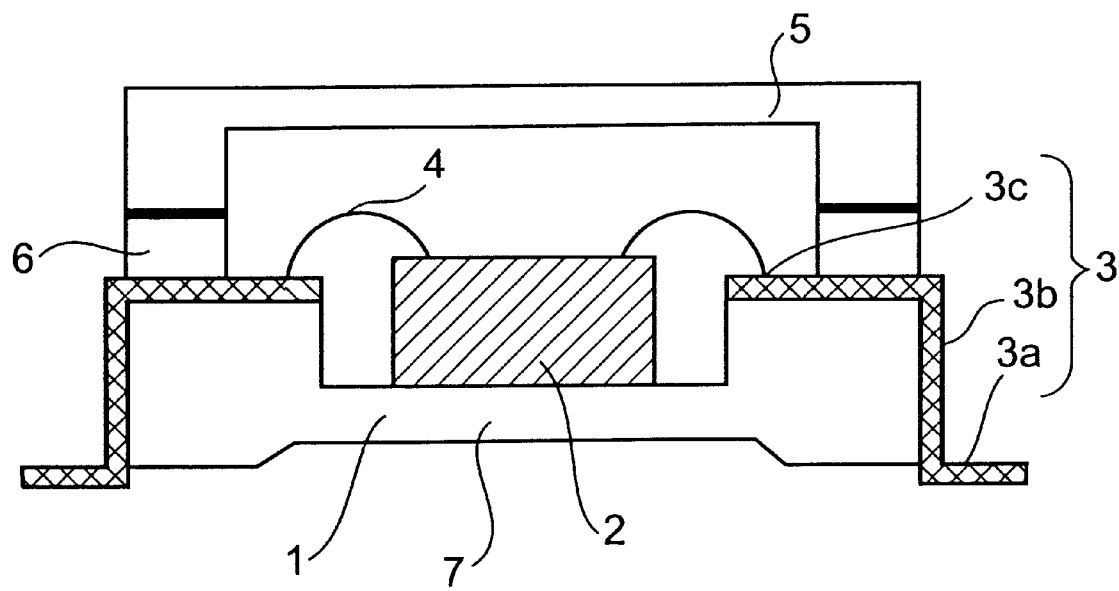
FIG. 9 is a cross section of an electronic part according to an eighth embodiment of the invention.

Referring to FIG. 9, in an electronic part according to an eighth embodiment, the recess 7 is formed on the bottom face of the resin base 1. By the recess 7, the characteristic degradation caused by bending, vibration and the like can be prevented. The recess 7 can be also applied to any of the first to seventh embodiments.

The electronic part of each of the foregoing embodiments has three sets of leads. The plane shape of the plastic package has dimensions of 3.0 mm×3.0 mm and height of 1.2 mm.

In each of the embodiments, no metal pattern such as a lead frame exists on and under the electronic device mounting face of the resin base 1. Since the plastic package is used, the electronic part can be produced at low cost. Degradation in high frequency characteristics due to equivalent stray capacitances generated from a metal pattern does not occur. On the electronic device mounting face, not only the surface acoustic wave device, electronic parts such as resistor, capacitor, and inductance can be mounted. Since the leads can be formed in various shapes in each of the electronic parts of the embodiments, the invention can be applied to various substrate wiring shapes on which electronic parts are mounted.

Figure 10:
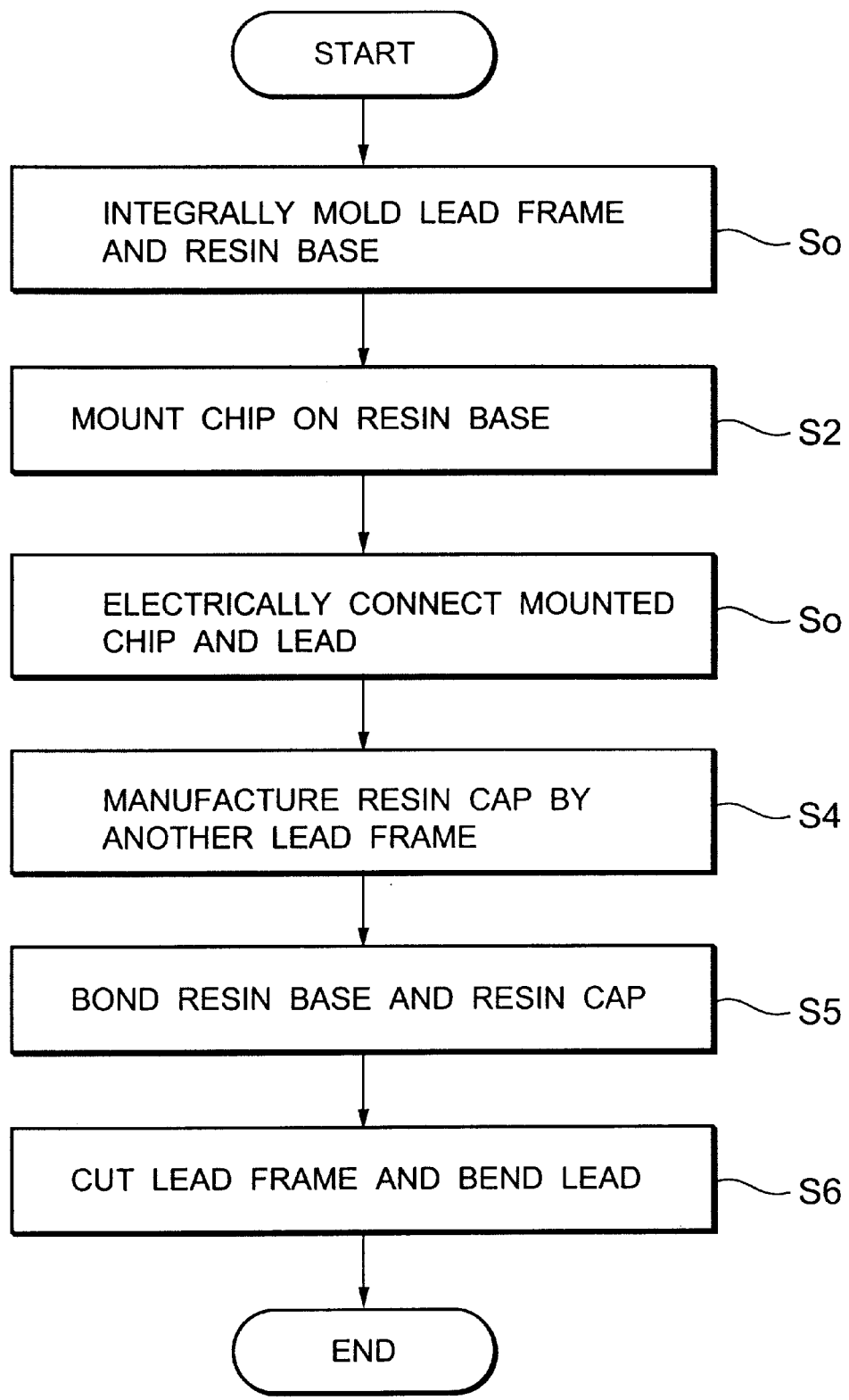
FIG. 10 is a flowchart of an assembling process of an electronic part of the invention.

With reference to the flowchart of FIG. 10, a process of assembling the electronic part is performed as follows. A lead frame and a mold are set in predetermined positions, a resin is charged in the mold, and the lead frame and the resin base are integrally molded (step S1). On the integrally molded resin base, for example, a chip of a surface acoustic wave device (electronic device) is mounted (step S2). In this case, a silicon adhesive is applied in advance on the resin base, and the chip is mounted on the adhesive. The mounted chip and an internal lead are electrically connected by a bonding wire (step S3). A resin cap pre-molded by another lead frame or the like (step S4) is bonded to the resin base by using a thermosetting resin (step S5). The lead frame is cut and, as necessary, bent along the outer shape of the plastic package (step S6).

Figure 11:
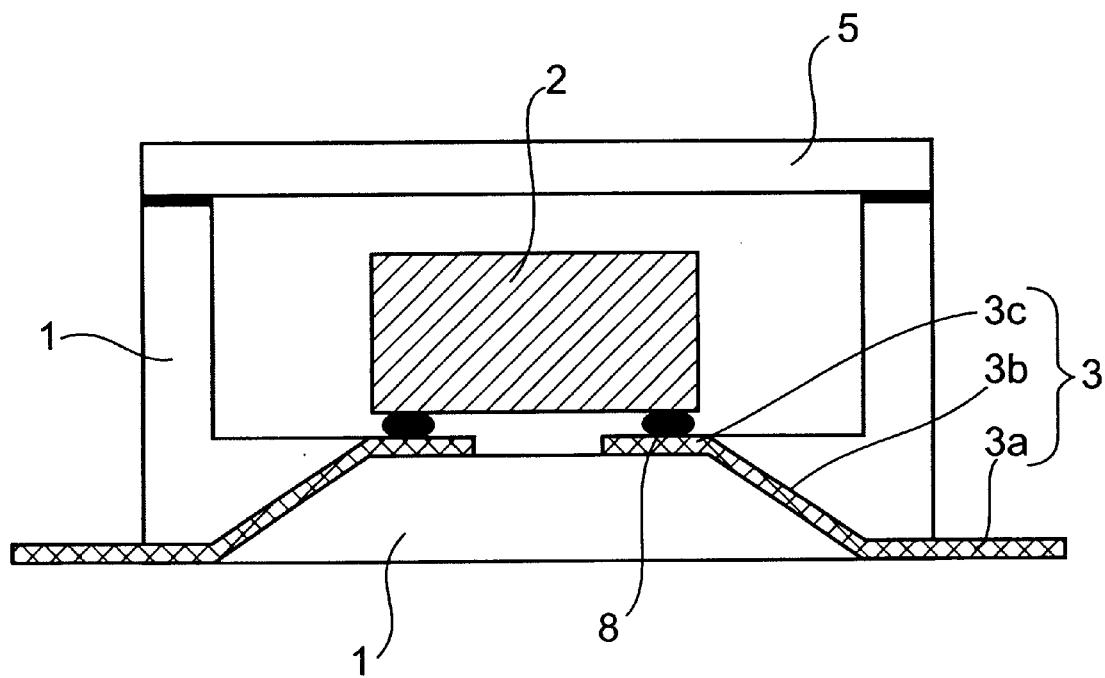
FIG. 11 is a cross section of an electronic part according to a ninth embodiment of the invention.

Referring to FIG. 11, in the electronic part of the ninth embodiment, the electronic device 2 is disposed so that its electrode pattern forming surface faces the resin base 1 via the space. The electrode pattern is connected to the lead portion 3c by a connecting conductor 8. As the connecting conductor 8, for example, gold, copper, solder or the like is used. The connecting conductor 8 can be preliminarily provided for the lead portion 3c or on the electronic device 2. When the electrode pattern of the electronic device 2 is disposed so as to face the resin base 1 as in the ninth embodiment, the lead can be arranged as shown in any of FIGS. 2 to 9. According to the ninth embodiment, the electronic device 2 is mounted so as to face downward, so that the electrode pattern of the electronic device 2 can be prevented from being damaged in the assembling process. In the configuration, since no bonding wire is necessary, the electronic device and the resin cap 5 can be disposed close to each other. The electronic device of the example can realize the small and short shape which is required by a portable telephone or the like.

Figure 12:
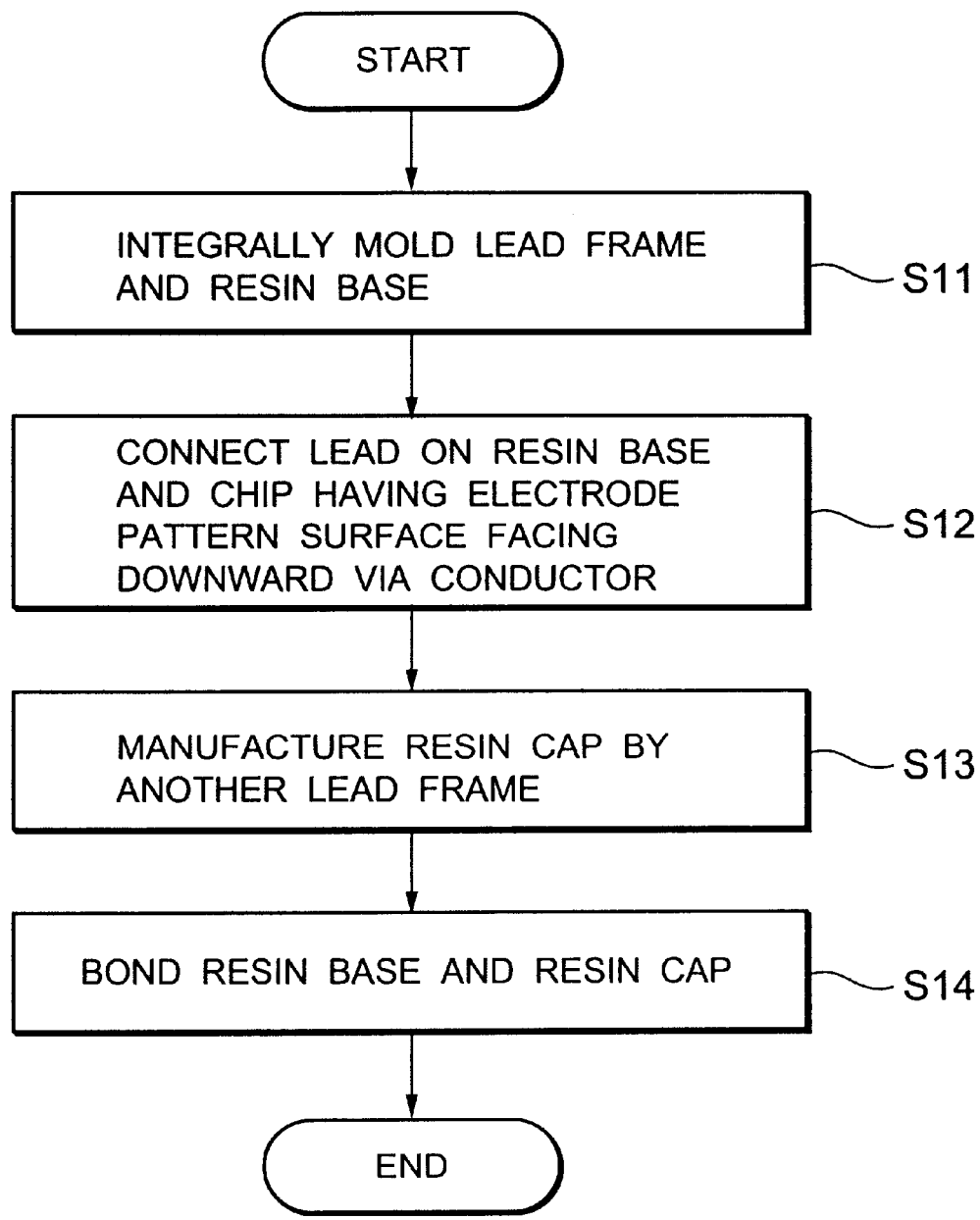
FIG. 12 is a flowchart showing an assembling process of the electronic part according to the ninth embodiment of the invention.

With reference to the flowchart of FIG. 12, the assembling process of the electronic part shown in FIG. 11 will be described as follows. A lead frame and a mold are set in predetermined positions, a resin is charged in the mold, and the lead frame and the resin base are integrally molded (step S11). The lead portion 3c on the resin base and the electrode pattern of the chip (electronic device 2) are connected to each other via the connecting conductor 8 (step S12). The resin cap 5 pre-molded by another lead frame or the like (step S13) is bonded to the resin base by using a thermosetting resin (step S14). After that, the lead frame can be cut.

The number of manufacturing steps of the electronic part of the invention.is smaller and the manufacturing cost of the electronic part is lower as compared with an electronic part having a ceramic package or the like.

While the present invention has been described in connection with certain preferred embodiments, it is to be understood that-the subject matter encompassed by the present invention is not limited to those specific embodiments. On the contrary, it is intended to include all alternatives, modifications, and equivalents as can be included within the spirit and scope of the following claims.

What is claimed is:

1. An electronic part comprising:
    a resin base having a top face, a bottom face and a side face connecting the top and bottom faces;
    a lead disposed within the resin base, the lead having a first portion extending from the top face to the bottom face of the resin base, a second portion projecting out from and along the bottom face of the resin base towards the side face and a third portion extending out beyond the side face of the resin base in a direction substantially parallel with the second portion;
    at least one electronic device mounted on the top face of the resin base;
    a conductor connecting the first portion of the lead to the electronic device; and
    a resin cap bonded on the resin base so as to form a space between the resin cap and the resin base.

2. The electronic part according to claim 1, wherein the electronic device includes a surface acoustic wave device.

3. The electronic part according to claim 1, wherein the lead is formed so as to extend around the electronic device.

4. The electronic part according to claim 1, wherein the resin base has a recess in its top face, in which the electronic device is disposed.

5. The electronic part according to claim 1, wherein the conductor is a bonding wire.

6. The electronic part according to claim 1, wherein the electronic device is adhered on the top face of the resin base by an adhesive.

7. The electronic part according to claim 1, wherein the electronic device includes an electrode pattern forming surface facing and spaced from the top face of the resin base, and the electrode pattern and the first portion of the lead are electrically connected to each other via the conductor.

8. The electronic part according to claim 7, wherein the conductor is selected from the group consisting of gold, solder and copper.

9. The electronic part according to claim 1, wherein the resin base has a recess in the bottom face.

10. The electronic part according to claim 1, wherein the resin base includes a plurality of leads.

11. A method of assembling an electronic part, the method comprising:
    forming a resin base by integrally molding a resin and a lead frame such that the lead frame has a first portion which extends from a top face to a bottom face of the resin base, a second portion which projects out from and extends along the bottom face of the resin base and a third portion which extends out beyond a side face of the resin base in a direction substantially parallel with the second portion, the side face connecting the top face and the bottom face;
    mounting an electronic device on the top face of the resin base;
    electrically connecting the electronic device and the first portion of the lead frame; and
    bonding a resin cap on the resin base.

12. The method of assembling an electronic part according to claim 11, wherein the electronic device is mounted on the top face of the resin base by an adhesive.

13. The method of assembling an electronic part according to claim 11, wherein the electronic device includes an electrode pattern forming surface and the electronic device is mounted so that the electrode pattern forming surface faces and is spaced from the top face of the resin base.

14. The method of assembling an electronic part according to claim 13, wherein the electrode pattern and the lead portion on the top face of the resin base are electrically connected to each other via a conductor.

15. The method of assembling an electronic part according to claim 14, wherein the conductor is selected from the group consisting of gold, solder and copper.

16. The method of assembling an electronic part according to claim 11, further comprising cutting a predetermined portion of the lead frame.

* * * * *